April 13, 1965 JOJI HAMASAKI 3,178,650

FOUR-TERMINAL, NEGATIVE-RESISTANCE AMPLIFYING CIRCUIT

Filed Aug. 16, 1961 2 Sheets-Sheet 2

United States Patent Office 3,178,650
Patented Apr. 13, 1965

3,178,650
FOUR-TERMINAL, NEGATIVE-RESISTANCE AMPLIFYING CIRCUIT

Joji Hamasaki, 70 Ookayama, Meguro-ku, Tokyo-to, Japan

Filed Aug. 16, 1961, Ser. No. 131,785
Claims priority, application Japan, Dec. 5, 1960, 35/47,321; Feb. 7, 1961, 36/3,501
5 Claims. (Cl. 330—61)

This invention relates to negative-resistance amplifiers, and more particularly it relates to a new four-terminal type amplifying circuit wherein negative-resistance elements are used.

It is generally known that when a power signal is applied on a negative resistance or a negative conductance, amplification of the signal is accomplished. In the case of a conventional amplifying circuit wherein negative-resistance elements are used, the power signal to be amplified is applied as an incident wave to the circuit having negative resistance, and the reflected wave is led out as the output. In this kind of reflection-type amplifying circuit, a non-reciprocal circuit such as a circulator or an isolator, or a circuit such as a hybrid circuit which separates the incident wave and the reflected wave, has been necessary.

However, the usable frequency range of these circuits have been relatively narrow, and not only have their losses been negligible, but their physical dimensions have also not been considerably large. Accordingly, these circuits have had such disadvantages as that of narrow amplification frequency range and a high noise factor and large physical dimensions.

It is an essential object of the present invention to provide a new negative resistance amplifying circuit wherein the numerous disadvantages, such as those described above, which occur in the conventional circuits of this type known heretofore, are eliminated.

It is another object of the invention to provide such a new circuit as above-stated which has a simple construction yet has highly desirable characteristics and performance.

The foregoing objects, other objects, and advantages, as will be apparent hereinafter, have been achieved by the amplifying circuit of the present invention, which described in general terms, is characterized by effecting four-terminal type, negative-resistance amplification by connecting two negative-resistance elements or circuits equivalent to said negative-resistance elements by way of phase-shifting circuit which accomplish phase shifting of a magnitude equal to an odd number multiple of 90 degrees or approximately 90 degrees.

The details of the invention will be more clearly apparent by reference to the following detailed description when taken in connection with the accompanying illustrations in which the same and equivalent parts are designated by the same reference numerals or letters, and in which.

Figure 1:
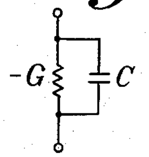
FIG. 1 is an electrical connection diagram representing one example of an equivalent circuit of a negative-resistance element or a circuit equivalent to a negative-resistance element.
Figure 2:
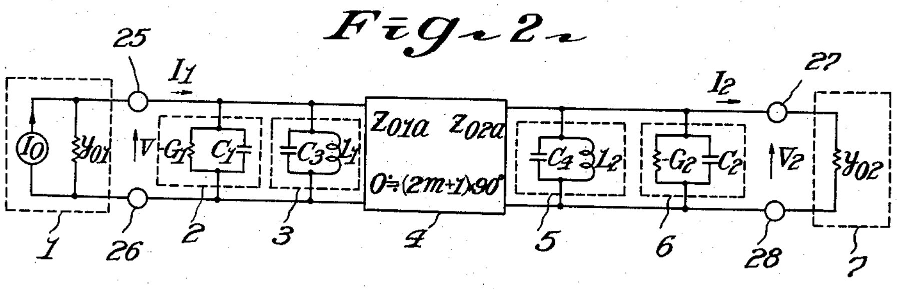
FIG. 2 is an electrical connection diagram indicating one embodiment of the present invention.

First, the case wherein an equivalent circuit of an actual negative-resistance element consisting of a parallel circuit of a negative conductance ($-G$) and an electrostatic capacitance C inevitably accompany a negative resistance element, as indicated in FIG. 1, will be described. One embodiment of the four-terminal, negative-resistance amplifying circuit according to the invention is indicated by the connection diagram shown in FIG. 2. Referring to FIG. 2, a signal source 1 consisting of a parallel circuit of a constant-current source $I_0$ and an internal conductance $y_{01}$ is connected in parallel to a first negative-resistance element 2 consisting of a parallel circuit of a negative conductance $-G_1$ and an accompanying electrostatic capacitance $C_1$. A first tuning auxiliary circuit 3 formed by a parallel circuit of an inductance $L_1$ and an electrostatic capacitance $C_3$ is connected in parallel with the negative-resistance element 2. The said capacitance $C_3$ is provided for the purpose of adjusting frequency characteristic and is an element which at times may not be connected.

The terminals common to the circuits 1, 2, and 3 are connected to the terminals of the image impedance $Z_{01a}$ of a phase-shifting circuit 4 which has image impedances $Z_{01a}$ and $Z_{02a}$ of pure resistances and has a phase constant $\theta$. In the embodiment shown in FIG. 2, a load 7, which is represented by a load conductance $y_{02}$, is connected in parallel with a second negative-resistance element 6 consisting of a parallel circuit which is composed of a negative conductance $-G_2$ and an accompanying electrostatic capacitance $C_2$. A second tuning auxiliary circuit 5, which consists of a parallel circuit composed of an inductance $L_2$ and an electrostatic capacitance $C_4$, is connected in parallel with the element 6. The capacitance $C_4$ is for the purpose of adjusting frequency characteristic and is an element which at times may not be connected. The terminals common to the circuits 5 and 6 and the load 7 are connected to the terminals of the image impedance $Z_{02a}$ of the phase-shifting circuit 4.

The amplifying circuit according to the present invention, as exemplified by the embodiment shown in FIG. 2, is a composite circuit comprising elements 2, 3, 4, 5, and 6 included between terminals 25–26 and terminals 27–28. In the embodiment shown, the two negative-resistance elements 2 and 6 are connected by way of the circuit 4 which effects phase shifting.

Since, in the amplifying circuit of this invention, the sum of the susceptances of $C_1$ and $C_3$, as illustrated in FIG. 2, is cancelled at the amplification center frequency by the suceptance of the inductance $L_1$, the admittance of the parallel circuit of the elements 2 and 3 is equal, at the amplification center frequency, to the negative conductance $-G_1$.

When a signal is sent from the signal source 1 which has the internal conductance $y_{01}$, through the terminals 25 and 26, to the composite circuit composed of the elements 2, 3, 4, 5, and 6, the signal is first amplified by the pure negative conductance $-G_1$. One portion of the signal power thus amplified is reflected to the signal source 1, while another portion is transmitted through the phase-shifting circuit 4 and reaches the parallel circuit of the elements 5, 6, and 7. The ratio between the reflected power and the transmited power is determined by the magnitude of the negative conductance $-G_1$ and the value of the image impedance $Z_{01a}$ of the phase-shifting circuit 4. Since, in the embodiment of this invention shown in FIG. 2, the phase constant $\theta$ of the phase-shifting circuit 4 is equal to an odd number multiple of 90 degrees or approximately 90 degrees, the phase of the signal which enters the parallel circuit of the elements 5, 6 and 7 is retarded by an odd number multiple of 90 degrees or approximately 90 degrees relative to the phase of the signal which was first applied on the circuit 4. Since the sum of the susceptances of the capacitances $C_2$ and $C_4$, of FIG. 2, is cancelled at the amplification center frequency by the susceptance of the inductance $L_2$, the admittance of the parallel circuit of the elements 5 and 6 is equal, at the amplification center frequency, to the negative conductance $-G_2$.

The signal which has been first amplified by the composite circuit composed of the elements 2 and 3 and has been transmitted through the circuit 4 is further amplified by the negative conductance $-G_2$. Then, one portion of the signal thus amplified is consumed in the load conductance 7, while another portion is reflected and is transmitted again through the circuit 4 to reach the composite circuit composed of the elements 2 and 3. The ratio between the transmitted power and the reflected power is determined by the magnitude of the negative conductance $-G_2$ and the value of the image impedance $Z_{02a}$ of the phase-shifting circuit 4. Since the phase of the signal which has reached the composite circuit composed of the elements 2 and 3 is retarded again, in being transmitted through the circuit 4, by an odd number multiple of 90 degrees or approximately 90 degrees, the phase of the signal which has been further amplified again by the composite circuit composed of the elements 2 and 3 and has been sent back to the signal source 1 is of the opposite phase or almost the opposite phase relative to the phase of the afore-mentioned signal which has been first amplified by the composite circuit composed of the elements 2 and 3 and reflected to be returned to the signal source 1.

It is a feature of the present invention that the magnitudes of the negative conductance $-G_1$, impedance $Z_{01a}$, conductance $-G_2$, and impedance $Z_{02a}$ are so predetermined that the aforesaid signals which are sent back to the signal source 1 mutually cancel each other. Accordingly, as a whole, the power which is reflected to the signal source 1 is dissipated or almost entirely disappears, and all of the signal power or almost all of the signal power generated at the signal source 1 is imparted to the amplifying circuit. In the composite circuit composed of the elements 2, 3, 4, 5, and 6, positive resistances such as would consume signal power are not included. Moreover, since the signal is amplified by the composite circuit composed of the elements 2 and 3 and the composite circuit composed of the elements 5 and 6, the amplified signal is consumed in the load 7.

As is apparent from the foregoing description of the circuit of the present invention, since the circuit 4 has a phase-shift of an odd number multiple of 90 degrees or of a value close thereto, the composite circuit composed of the elements 2, 3, 4, 5, and 6, which is included between the terminals 25–26 and terminals 27–28, is a four-terminal, negative-resistance amplifying circuit which is matched.

Figure 3:
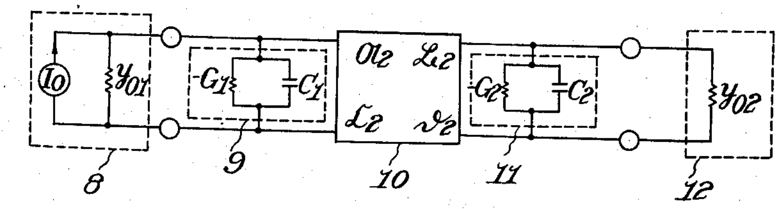
FIG. 3 is an electrical connection diagram indicating another embodiment of the invention.

The nature of the present invention will be more clearly apparent from the following description of a more general form thereof, with reference of FIG. 3, which shows another embodiment of the invention. In this embodiment, a signal source 8, represented by a parallel circuit of a constant current source $I_0$ and an internal conductance $y_{01}$, is connected in parallel with a first negative-resistance element 9, represented by a parallel circuit of a negative conductance $-G_1$ and an accompanying electrostatic capacitance $C_1$. A load 12, represented by a load conductance $y_{02}$ is connected in parallel with a second negative-resistance element 11, represented by a parallel circuit of a negative conductance $-G_2$ and an accompanying electrostatic capacitance $C_2$. Between the elements 9 and 11 is connected a four-terminal circuit 10, which has, at the amplification center frequency, a four-terminal constant equal to that of the composite circuit composed of the elements 3, 4, and 5 of FIG. 2. Since the elements 3 and 5, in FIG. 2 are supplementary circuits, the circuit 10 in the embodiment of FIG. 3 is a circuit which effects phase-shifting of an odd number multiple of 90 degrees or approximately 90 degrees. To the two pairs of terminals of the circuit 10 are connected a composite circuit composed of the elements 8 and 9 and a composite circuit composed of the elements 12 and 11, corresponding to the connections shown in FIG. 2. In FIG. 3, the two negative-resistance elements 9 and 11 are connected by way of the circuit 10 which effects phase shifting.

The amplifying circuit according to the invention, as shown in the embodiment of FIG. 3, is the composite circuit composed of the elements 9, 10, and 11. Since this circuit is equivalent to the composite circuit composed of the elements 2, 3, 4, 5, and 6 as shown in FIG. 2 at amplification center frequency, it is clear that this composite circuit composed of the elements 9, 10, and 11 is a four-terminal, negative-resistance amplifying circuit which is matched.

As one modification of the present invention, the negative-resistance element may be represented by an equivalent circuit wherein the electrostatic capacitance as shown in FIG. 1 is replaced by an inductance, and the negative conductance is replaced by a negative resistance. In the case of this modification, as applied to the afore-described embodiments illustrated in FIGS. 2 and 3, the constant current source is replaced by a constant-voltage source, the conductances by resistances, electrostatic capacitances by inductances, and inductances by electrostatic capacitances. Moreover, parallel connections are replaced by series connections, and series connections by parallel connections. It will be apparent that, through the circuit resulting from the above-stated replacements, a four-terminal, negative-resistance amplifying circuit according to the present invention can be obtained.

In the foregoing description, the elements 2, 6, 9, and 11 have been negative-resistance elements. A circuit which is a combination of a negative-resistance element and another circuit element, and which can be represented, within the operating frequency range, by a parallel circuit of a negative conductance and a susceptance or by a series circuit of a negative resistance and a reactance, shall be herein defined as a circuit equivalent to a negative-resistance element. It will then be apparent that, with this definition, the four-terminal, negative-resistance circuit of the present invention can be obtained if all, or any one, of the elements 2, 6, 9, and 11 are circuits equivalent to the negative-resistance element.

Figure 4:
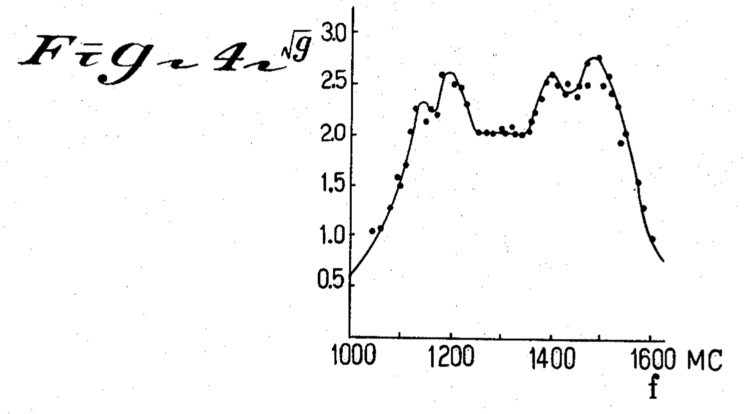
FIG. 4 is a graph illustrating one experimental result of the amplifying circuit of the invention.
Figure 5:
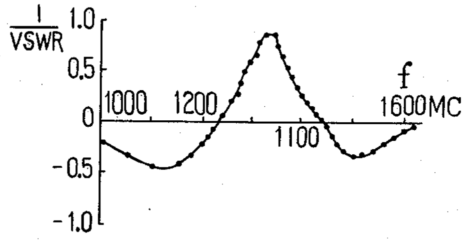
FIG. 5 is a graph illustrating another experimental result of the amplifying circuit of the invention.

The principle of the amplifier of the present invention has been experimentally confirmed, the results being as indicated in FIGS. 4 and 5. In FIG. 4, the abscissa indicates operation frequency, and the ordinate indicates the square root of a power amplification factor, of the amplifying circuit. As is clear from FIG. 4, the amplifying circuit of the present invention, in the frequency range of from 1,050 megacycles to 1,600 megacycles per second, has a power amplification factor which is greater than one.

In FIG. 5, the abscissa indicates operation frequency, and the ordinate indicates the reciprocal of the input voltage-standing-wave ratio of the amplifier. Positive values of the ordinate indicate input voltage-standing-wave ratio which have positive conductances, and negative values indicate input voltage-standing-wave ratios which have negative conductances. As will be apparent from FIG. 5, the amplifying circuit of the present invention has an input voltage-standing-wave ratio which has a positive conductance within a range of 1,230 megacycles to 1,440 megacycles per second, and is almost exactly matched in the vicinity of 1,335 megacycles per second.

As will be readily seen from the foregoing description and experimental results, the present invention provides a stable, four-terminal, negative-resistance amplifying circuit of matched input and output, which does not contain such circuits as a circulator, isolator, or a hybrid circuit, by connecting two negative-resistance elements or circuits equivalent to negative-resistance elements by way of a circuit which effects phase shifting of a magnitude equal to an odd number multiple of 90 degrees or approximately 90 degrees. By means of the amplifying circuit of the invention thus constructed, it is possible to exhibit fully the characteristics of an amplifying circuit of wide band and low noise in the high-frequency band.

In order to indicate still more fully the nature and principle of the present invention, the following mathematic considerations are set forth.

Referring first to the circuit of FIG. 2, if the angular frequency is denoted by $\omega$, and the square root of $-1$ by $j$, the following equation is obtained.

$$\Omega=\frac{\omega}{\omega_{01}}-\frac{\omega_{01}}{\omega} \qquad \text{(i)}$$

where $\Omega$ is the normalized frequency, and $$\omega_{01}=\frac{1}{\sqrt{L_1(C_1+C_3)}}=\frac{1}{\sqrt{L_2(C_2+C_4)}} \qquad \text{(ii)}$$

The following equations are considered.

$$Q_1=\frac{\omega_{01}(C_1+C_3)}{G_1} \qquad \text{(iii)}$$

$$Q_2=\frac{\omega_{02}(C_2+C_4)}{G_2} \qquad \text{(iv)}$$

$$y_1=G_1(-1+jQ_1\Omega) \qquad \text{(v)}$$

$$y_2=G_2(-1+jQ_2\Omega \qquad \text{(vi)}$$

The voltage between the terminals 25–26 of the signal source 1 is denoted by $V_1$, the current by $I_1$, the voltage between the terminals 27–28 of the load 7 by $V_2$, and the current by $I_2$. In FIG. 2, the four-terminal equation and the four-terminal constants $$\mathcal{A}_1, \mathcal{B}_1, \mathcal{C}_1, \text{ and } \mathcal{D}_1,$$

of the four-terminal circuit contained between the terminal 25–26 and terminals 27–28 are as follows:

$$V_1=\mathcal{A}_1V_2+\mathcal{B}_1I_2 \qquad \text{(vii)}$$

$$I_1=\mathcal{C}_1V_2+\mathcal{D}_1I_2 \qquad \text{(viii)}$$

$$\mathcal{A}_1=\sqrt{\frac{Z_{01a}}{Z_{02a}}}\cos\theta+jy_2\sqrt{Z_{01a}Z_{02a}}\sin\theta \qquad \text{(ix)}$$

$$\mathcal{B}_1=j\sqrt{Z_{01a}Z_{02a}}\sin\theta \qquad \text{(x)}$$

$$\mathcal{C}_1=\left(y_1\sqrt{\frac{Z_{01a}}{Z_{02a}}}+y_2\sqrt{\frac{Z_{02a}}{Z_{01a}}}\right)\cos\theta+ j\left(\frac{1}{\sqrt{Z_{01a}Z_{02a}}}+y_1y_2\sqrt{Z_{01a}Z_{02a}}\right)\sin\theta \qquad \text{(xi)}$$

$$\mathcal{D}_1=\sqrt{\frac{Z_{02a}}{Z_{01a}}}\cos\theta+jy_1\sqrt{Z_{01a}Z_{02a}}\sin\theta \qquad \text{(xii)}$$

If, with use of the equations set forth on page 174 of the "Electrical Engineering Handbook," published on July 25, 1951, by the Institute of Electrical Engineers of Japan, the image impedance $Z_{I1}$ of the terminals 25–26 and the image impedance $Z_{I2}$ of the terminals 27–28 of the four-terminal circuit contained between the terminals 25–26 and terminals 27–28 as shown in FIG. 2 are determined, the image impedances may be expressed as follows by the use of the four-terminal constants of the Equations ix, x, xi, and xii:

$$Z_{I_1}=\sqrt{\frac{\mathcal{A}_1\mathcal{B}_1}{\mathcal{D}_1\mathcal{C}_1}} \qquad \text{(xiii)}$$

$$Z_{I_2}=\sqrt{\frac{\mathcal{D}_1\mathcal{C}_1}{\mathcal{A}_1\mathcal{B}_1}} \qquad \text{(xiv)}$$

The amplifying circuit of this invention as indicated in FIG. 2 is a composite circuit comprising the circuit elements 2, 3, 4, 5, and 6 included between the terminals 25–26 and terminals 27–28, as was mentioned hereinbefore. In the present invention, since, when $m$ is caused to be a positive or negative integer or zero, the phase constant $\theta$ of the element 4 in FIG. 2 is $(2m+1)$ times 90 degrees, $\cos\theta=0$ and $\sin\theta=(-1)^m$; and furthermore, $\Omega=0$, $y_1=-G_1$, and $y_2=-G_2$ from Equations i, v, and vi, for an angular frequency $\omega=\omega_{01}$. Accordingly, from the Equations ix, x, xi, xii, xiii, and xiv, the aforesaid impedances $Z_{I_1}$ and $Z_{I_2}$ become positive real quantities, as follows:

$$Z_{I_1}=\sqrt{\frac{G_2}{G_1}\times\frac{1}{G_1G_2+\frac{1}{Z_{01a}Z_{02a}}}} \qquad \text{(xv)}$$

$$Z_{I_2}=\sqrt{\frac{G_1}{G_2}\times\frac{1}{G_1G_2+\frac{1}{Z_{01a}Z_{02a}}}} \qquad \text{(xvi)}$$

In the present invention, the values of $G_1$, $G_2$, $Z_{01a}$, and $Z_{02a}$ are predetermined so as to satisfy the relations $$y_{01}=\sqrt{\frac{G_1}{G_2}\times\left(G_1G_2+\frac{1}{Z_{01a}Z_{02a}}\right)} \qquad \text{(xvii)}$$

and $$y_{02}=\sqrt{\frac{G_2}{G_1}\times\left(G_1G_2+\frac{1}{Z_{01a}Z_{02a}}\right)} \qquad \text{(xviii)}$$

that is, so as to satisfy the relations $$\frac{G_1}{y_{01}}=\frac{G_2}{y_{01}}>1 \qquad \text{(xix)}$$

and $$\frac{1}{Z_{01a}Z_{02a}}=y_{01}y_{02}\left\{1-\left(\frac{G_1}{y_{01}}\right)^2\right\} \qquad \text{(xx)}$$

Accordingly, by substituting the Equations xix and xx into the Equations xv and xvi, the following equations are obtained.

$$Z_{I_1}=\frac{1}{y_{01}} \qquad \text{(xxi)}$$

$$Z_{I_2}=\frac{1}{y_{02}} \qquad \text{(xxii)}$$

This means, accordingly, that the amplifier of the present invention which is contained between the terminals 25–26 and terminals 27–28 is fully matched to both the signal source and the load.

To determine the power amplification factor $g_1$ of the four-terminal circuit contained between the terminals 25–26 and terminals 27–28 as indicated in FIG. 2, this power amplification factor $g_1$ can be expressed by the following equation since it is the ratio between the power $y_{02}|V_2|^2$ which is consumed in the load 7 and the power $|I_0|^2/4y_{01}$ which can be supplied by the signal source to the load with which the signal source is matched.

$$g_1=\frac{y_{02}|V_2|^2}{|I_0|^2/4y_{01}}=\frac{1}{|F|^2} \qquad \text{(xxiii)}$$

where $$F=\frac{1}{2\sqrt{y_{01}y_{02}}}\times\frac{I_0}{V_2} \qquad \text{(xxiv)}$$

The quantity F of the Equations xxiii and xxiv is determined from the four-terminal constants $$\mathcal{A}_1, \mathcal{B}_1, \mathcal{C}_1, \text{ and } \mathcal{D}_1,$$

and the Equations ix, x, xi, and xii, as follows:

$$F=\frac{1}{2}\left(\sqrt{\frac{y_{01}}{y_{01}}}\mathcal{A}1+\sqrt{\frac{y_{02}}{y_{01}}}\mathcal{D}1+\sqrt{y_{01}y_{02}}\mathcal{B}1+\frac{1}{\sqrt{y_{01}y_{02}}}\mathcal{C}1\right)=$$

$$j\frac{\sin\theta}{2}\sqrt{Z_{01a}Z_{02a}y_{01}y_{02}}\Big[\frac{G_1G_2}{y_{01}y_{02}}Q_1Q_2(j\Omega)^2+$$

$$j\Omega\frac{G_1Q_1}{y_{01}}\left(1-\frac{G_2}{y_0{}^2}\right)+\frac{G_2Q_2}{y_{02}}\left(1-\frac{G_1}{y_{01}}\right)-$$

$$j\left(\frac{G_1Q_1}{y_{01}}\cdot\frac{1}{Z_{02a}y_{02}}+\frac{G_1Q_2}{y_{02}}\cdot\frac{1}{Z_{01a}y_{01}}\right)\cot\theta\Big\}+$$

$$\frac{1}{Z_{01a}Z_{02a}y_{01}y_{02}}+\left(1-\frac{G_1}{y_{01}}\right)\left(1-\frac{G_2}{y_{02}}\right)-$$

$$j\left\{\left(1-\frac{G_1}{y_{01}}\right)\frac{1}{Z_{02a}y_{02}}+\left(1-\frac{G_2}{y_{02}}\right)\frac{1}{Z_{01a}y_{01}}\right\}\cot\theta$$

In the present invention, the phase constant $\theta$ of the circuit element 4 in FIG. 2 is $(2m+1)$ times 90 degrees, and, at the same time, $G_1$, $G_2$, $Z_{01a}$, and $Z_{02a}$ satisfy the Equations xix and xx. Therefore, $\cot\theta=0$ and $\sin\theta=(-1)^m$. By substituting the Equations xix and xx into the Equation xxv, the following equation is obtained.

$$F=j\frac{(-1)^m}{2}\cdot\frac{1}{\sqrt{1-\left(\frac{G_1}{y_{01}}\right)^2}}\cdot\left[\left(\frac{G_1}{y_{01}}\right)^2Q_1Q_2(j\Omega)^2+\right.$$

$$\left.j\Omega\frac{G_1}{y_{01}}\left(1-\frac{G_1}{y_{01}}\right)(Q+Q_2)+2\left(1-\frac{G_1}{y_{01}}\right)\right]\qquad\text{(xxvi)}$$

The coefficients of the quadratic expression with respect to $j\Omega$ within the large brackets of the Equation xxvi become positive real quantities from the Equation xix, as follows:

$$\left(\frac{G_1}{y_{01}}\right)^2Q_1Q_2>0\qquad\text{(xxvii)}$$

$$\frac{G_1}{y_{01}}\left(1-\frac{G_1}{y_{01}}\right)(Q_1+Q_2)>0\qquad\text{(xxviii)}$$

$$2\left(1-\frac{G_1}{y_{01}}\right)>0\qquad\text{(xxix)}$$

Accordingly, the roots resulting from a solution of the Equation xxvi equated to zero, that is, $F=0$, considered as a quadratic equation with respect to $j\Omega$ contain, in all cases, negative real parts. Since instability of the circuit indicated in FIG. 2 is limited to the case wherein $g_1=\infty$, that is, wherein the quantity $j\Omega$ for $F=0$ contains a positive or zero real part, the amplifier of the present invention which has a quantity F expressed by the Equation xxvi is stable. If an equation resulting from taking $\Omega=0$ in the Equation xxvi is substituted into the Equation xxiii, the power amplification factor $g_1$ $(\omega=\omega_{01})$, for the condition of amplification center angular velocity $\omega=\omega_{01}$, can be determined as follows:

$$g_1(\omega=\omega_{01})=\frac{1+\frac{G_1}{y_{01}}}{1-\frac{G_1}{y_{01}}}\qquad\text{(xxx)}$$

Since, according to the Equation xix, the value of $g_1$ $(\omega=\omega_{01})$ of the Equation xxx is greater than unity, amplification is certainly being accomplished in the amplifier of the present invention which has an F expressed by the Equation xxvi. Thus when $\theta=(2m+1)\times 90$ degrees, and at the same time, the conditions of the Equations xix and xx are satisfied, as in the case of the present invention, the composite circuit composed of the circuit elements 2, 3, 4, 5, and 6, contained between the terminals 25–26 and terminals 27–28 as indicated in FIG. 2, is an amplifier which is stable, has a power amplification factor greater than unity, and is fully matched with the signal source and the load.

The case wherein, in the circuit of FIG. 2, $\omega$ differs slightly from $\omega_{01}$, and, moreover, the conditions of the Equations xix and xx are not quite satisfied, will now be analyzed.

The Equations ix, x, xi and xii expressing the four-terminal constants $$\mathcal{A}_1, \mathcal{B}_1, \mathcal{C}_1, \text{ and } \mathcal{D}_1,$$

the Equations xiii and xiv expressing the image impedances $Z_{I_1}$ and $Z_{I_2}$, and the Equation xxv expressing the quantity F are, in each case, functional expressions which can be differentiated any number of times with respect to the variables $\omega$, $\theta$, $G_1$, $G_2$, $Z_{01a}$, and $Z_{02a}$. Moreover, the conditions of $\omega=\omega_{01}$, $\theta=(2m+1)\times 90$ degrees, and the Equations xix and xx do not produce singular points of these functional expressions. Accordingly, the amplifier of the present invention contained between the terminals 25–26 and terminals 27–28, as indicated in FIG. 2, which, when $\omega=\omega_{01}$, $\theta=(2m+1)\times 90$ degrees and the Equations xix and xx are valid, is stable, has an amplification factor greater than unity and is fully matched with the signal surce and the load also when $\omega$ is nearly equal to $\omega_{01}$, $\theta$ is nearly equal to $(2m+1)$ times 90 degrees, and the Equations xix and xx are almost satisfied.

As is apparent from the above consideration, since, in the amplifier of the present invention, $\theta$ is selected to be equal to an odd number multiple of 90 degrees or to a value close thereto, and at the time, $G_1$, $G_2$, $Z_{01a}$, and $Z_{02a}$ are so selected that the conditions of Equations xix and xx are satisfied or almost satisfied, the composite circuit composed of the circuit elements 2, 3, 4, 5, and 6 contained between the terminals 25–26 and terminals 27–28 as shown in FIG. 2 functions as a negative-resistance amplifier of four-terminal type which is stable and is matched.

The embodiment shown in FIG. 3 will now be analyzed below.

The composite circuit comprising tuning auxiliary circuit elements 3 and 5 and a phase-shifting circuit 4 as shown in FIG. 2 is realized, in the embodiment of FIG. 3, by a suitable circuit depending on the amplification frequency band. The four-terminal constants $$\mathcal{A}_2, \mathcal{B}_2, \mathcal{C}_2, \text{ and } \mathcal{D}_2$$

of the composite circuit composed of the circuit elements 3, 4, and 5 required for achieving the function of the four-terminal type, negative-resistance amplifier of the present invention at an angular frequency $\omega=\omega_{01}$ may be determined by substituting, in the Equations ix, x, xi, and xii, $\theta=(2m+1)\times 90$ degrees and the Equations xix and xx; substituting for $y_1$ the value resulting from subtracting the admittance $(-G_1+j\omega_{01}C_1)$ of the negative-resistance element 2 from the value $(-G_1)$ of $y_1$ at $\omega=\omega_{01}$; and substituting for $y_2$ the value resulting from substracting the admittance $(-G_2+j\omega_{01}C_2)$ of the negative-resistance element 6 from the value $(-G_2)$ of $y_2$ at $\omega=\omega_{01}$. That is, $$\mathcal{A}_2=\frac{(-1)^m\omega_{01}C_2}{\sqrt{y_{01}y_{02}\left\{1-\left(\frac{G_1}{y_{01}}\right)^2\right\}}}\qquad\text{(xxxi)}$$

$$\mathcal{B}_2=\frac{(-1)^m j}{\sqrt{y_{01}y_{02}\left\{1-\left(\frac{G_1}{y_{01}}\right)^2\right\}}}\qquad\text{(xxxii)}$$

$$\mathcal{C}_2=(-1)^m j\left[\sqrt{y_{01}y_{02}\left\{1-\left(\frac{G_1}{y_{01}}\right)^2\right\}}-\frac{\omega_{01}{}^2C_1C_2}{\sqrt{y_{01}y_{02}\left\{1-\left(\frac{G_1}{y_{01}}\right)^2\right\}}}\right]\qquad\text{(xxxiii)}$$

$$\mathcal{D}_2=\frac{(-1)^m\omega_{01}C_1}{\sqrt{y_{01}y_{02}\left\{1-\left(\frac{G_1}{y_{01}}\right)^2\right\}}}\qquad\text{(xxxiv)}$$

where $G_1/y_{01}$ satisfies the condition of the Equation xix. The reactance four-terminal circuits composed of lumped constant circuits or distributed constant circuits which have the four-terminal constants indicated by the Equations xxxi, xxxii, xxxiii and xxxiv, or combinations of these two kinds of the circuits, are all equivalent, at the amplification center, angular frequency of the amplifier of this invention, to the composite circuit of the tuning auxiliary circuit elements 3 and 5 and the phase-shifting circuit 4 shown in FIG. 2. At the same time, the circuit elements 3 and 5 are circuits of auxiliary nature. Therefore, all such four-terminal circuits are circuits which accomplish phase shifting by an old number multiple of 90 degrees. Accordingly, as is illustrated in general form in FIG. 3, by connecting in parallel a first negative-resistance element 9, represented by a parallel circuit of a negative conductance ($-G_1$) and an accompanying electrostatic capacitance $C_1$, and a signal source 8, represented by a parallel circuit of a constant-current source $I_0$ and internal conductance $y_{01}$, to the terminals on one side of a reactance four-terminal circuit 10, which has four-terminal constants indicated by the Equations xxxi, xxxii, xxxiii, and xxxiv, and connecting in parallel a second negative-resistance element 11, represented by a parallel circuit of a negative conductance ($-G_2$) and an accompanying electrostatic capacitance $C_2$, and a load 12, represented by a negative conductance $y_{02}$, to the terminals on the other side of the circuit 10, a four-terminal type, negative-resistance amplifier according to the present invention, which is matched with the signal source 8 and the load 12 is obtained.

In the case wherein the four-terminal constants of the four-terminal circuit 10 shown in FIG. 3 are close to their respective values given by the Equations xxxi, xxxii, xxxiii, and xxxiv, the circuit of FIG. 3 is equivalent to the circuit of FIG. 2 wherein $\theta$ is close to an odd number multiple of 90 degrees, and the conditions of the Equations xix and xx are almost satisfied. It will be apparent, therefore, that through such a circuit of FIG. 3 as described above, a four-terminal type, negative-resistance amplifier according to the present invention is obtainable.

Figure 6:
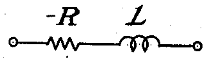
FIG. 6 is an electrical connection diagram representing another example of an equivalent circuit of a negative-resistance element.

The case wherein an equivalent circuit of the negative-resistance element is provided by a series circuit comprising a negative resistance ($-R$) and an inductance L inevitably accompanied by a negative-resistance element, as is indicated in FIG. 6, will now be considered below.

Figure 7:
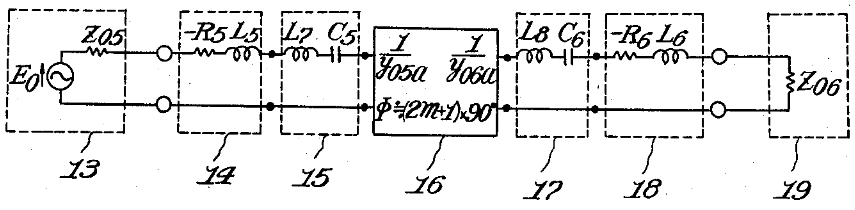
FIG. 7 is an electrical connection diagram indicating another embodiment of the present inevntion.

In this case, the amplifier according to this invention can be obtained by exchanging the functions of electric current and voltage indicated in FIG. 2 to form a circuit as shown in FIG. 7. More specifically, in FIG. 7 all of the parallel connections shown in FIG. 2 are replaced by series connections, and, at the same time, the signal source 1 shown in FIG. 2 is replaced by a signal source 13 represented by a series connection of a constant-voltage source $E_0$ and an internal resistance $Z_{05}$. The negative-resistance element 2 shown in FIG. 2 is replaced in FIG. 7 by a first negative-resistance element 14 represented by a series circuit of a negative resistance ($-R_5$) and an accompanying inductance $L_5$. The tuning auxiliary circuit 3 shown in FIG. 2 is replaced in FIG. 7 by a tuning auxiliary circuit 15 represented by a series circuit of an electrostatic capacitance $C_5$ and an inductance $L_7$. The phase-shifting circuit 4 shown in FIG. 2 is replaced in FIG. 7 by a phase-shifting circuit 16 which has image impedances $1/y_{05a}$ and $1/y_{06a}$ and a phase constant $\Phi$, the terminal of the images impedance $1/y_{05a}$ being connected to the circuit 15. The tuning auxiliary circuit 5 shown in FIG. 2 is replaced in FIG. 7 by a tuning auxiliary circuit 17 represented by a series circuit of an electrostatic capacitance $C_6$ and an inductance $L_8$, the circuit 17 is connected to the terminal of the image impedance $1/y_{06a}$ of the circuit 15. The negative-resistance element 6 shown in FIG. 2 is replaced in FIG. 7 by a second negative-resistance element 18 represented by a series circuit of a negative resistance ($-R_6$) and an accompanying inductance $L_6$. The load 7 shown in FIG. 2 is replaced in FIG. 7 by a load 19 represented by a load resistance $Z_{06}$. The inductances $L_7$ and $L_8$ of the tuning auxiliary circuit are elements which, in some cases, may not be connected.

At an amplification center, angular frequency $\omega_{02}$, the series circuit of the inductances $L_5$ and $L_7$ and the capacitance $C_5$ are in resonance, and the series circuit of the inductances $L_6$ and $L_8$ and the capacitance $C_6$ are in resonance.

Similarly as in the case of the Equations xix and xx, it can be demonstrated that the conditions under which the amplifier according to the present invention, consisting of the composite circuit of the circuit elements 14, 15, 16, 17, and 18 shown in FIG. 7, accomplishes a stable amplification while being matched with the signal source 13 and the load 19 are as expressed by the following relations.

$$\Phi=(2m+1)\times 90 \text{ degrees} \qquad \text{(xxxv)}$$

where $m$ is a positive or negative integer, or is equal to zero.

$$\frac{R_5}{Z_{05}}=\frac{R_6}{Z_{06}}<1 \qquad \text{(xxxvi)}$$

$$\frac{1}{y_{05a}y_{06a}}=Z_{05}Z_{06}\left\{1-\left(\frac{R_5}{Z_{05}}\right)^2\right\} \qquad \text{(xxxvii)}$$

The power amplification factor $g_2(\omega=\omega_{02})$ at angular frequency $\omega=\omega_{02}$ is given by the following equation.

$$g_2(\omega=\omega_{02})=\frac{1+\dfrac{R_5}{Z_{05}}}{1-\dfrac{R_5}{Z_{05}}} \qquad \text{(xxxviii)}$$

Similarly as in the case illustrated in FIG. 2, it can be demonstrated that an amplifier which, if the conditions of the Equations xxxv, xxxvi, and xxxvii are almost satisfied, is stable, has a power amplification factor greater than unity, and is substantially matched with the signal source 13 and load 19 can be obtained through the circuit shown in FIG. 7.

As is apparent from the foregoing description, in the present invention, since the phase constant $\Phi$ of the circuit 16 in the electrical connection shown in FIG. 7 is selected to be of a value which is an odd number multiple of 90 degrees or a value close thereto, and, at the same time, the values of $R_5$, $R_6$, $y_{05}$, and $y_{06}$ are so selected that the conditions of the Equations xxxvi and xxxvii are satisfied or very nearly satisfied, the circuit of the invention represented by the composite circuit of the circuit element 14, 15, 16, 17, and 18 accomplishes the operation of a four-terminal type, negative-resistance amplifier which is stable and is substantially matched.

Figure 8:
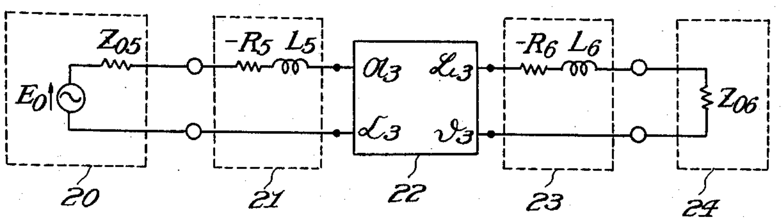
FIG. 8 is an electrical connection diagram indicating still another embodiment of the present invention.

In order to determine the above-described conditions of the present invention in a more general form, the following analysis is presented with reference to FIG. 8. The four-terminal constants $$\mathcal{A}_3, \mathcal{B}_3, \mathcal{C}_3, \text{ and } \mathcal{D}_3$$

which the composite circuit of the tuning auxiliary circuit elements 15 and 17 and the phase-shifting circuit 16 shown in FIG. 7 should have at an amplification center, angular frequency of $\omega=\omega_{02}$ may be determined in the following manner, similarly as in the case of their determination by the Equations xxxi, xxxii, xxxiii, and xxxiv.

$$\mathcal{A}_3=\frac{(-1)^m\omega_{02}L_5}{\sqrt{Z_{05}Z_{06}\left\{1-\left(\frac{R_5}{Z_{05}}\right)^2\right\}}} \qquad \text{(xxxix)}$$

$$\mathcal{B}_3=(-1)^m j\left[\sqrt{Z_{05}Z_{06}\left\{1-\left(\frac{R_5}{Z_{05}}\right)^2\right\}}-\frac{\omega_{02}L_5L_6}{\sqrt{Z_{05}Z_{06}\left\{1-\left(\frac{R_5}{Z_{05}}\right)^2\right\}}}\right] \qquad \text{(xxxx)}$$

$$\mathcal{L}_3=\frac{(-1)^m j}{\sqrt{Z_{05}Z_{06}\left\{1-\left(\frac{R_5}{Z_{05}}\right)^2\right\}}} \quad \text{(xxxxi)}$$

$$\mathcal{J}_3=\frac{(1)^m \omega_{02} L_6}{\sqrt{Z_{05}Z_{06}\left\{1-\left(\frac{R_5}{Z_{05}}\right)^2\right\}}} \quad \text{(xxxxii)}$$

where the quantity $R_5/Z_{05}$ satisfies the condition of the Equation xxxvi. The reactance four-terminal circuit composed of lumped constant circuits or distributed constant circuits which have the four-terminal constants indicated by the Equations xxxix, xxxx, xxxxi, and xxxxii, or combinations of these two kinds of circuits, are all equivalent, at the amplification center, angular frequency of the amplifier of this invention, to the composite circuit of the tuning auxiliary circuit elements 15 and 17 and the phase-shifting circuit 16 shown in FIG. 7. At the same time, since the circuit elements 15 and 17 are circuits of auxiliary nature, all such four-terminal circuits are circuits which accomplish phase shifting by an odd number multiple of 90 degrees.

In the circuit arrangement shown in FIG. 8, a first negative-resistance element 21, represented by a series circuit of a negative resistance ($-R_5$) and an accompanying inductance $L_5$, and a signal source 20, represented by a series circuit of a constant-voltage course $E_0$ and an internal resistance $Z_{05}$, are connected in series with the terminals on one side of a reactance four-terminal circuit 22 which has four-terminal constants expressed by the Equations xxxix, xxxx, xxxxi, and xxxxii. To the terminals on the other side of the four-terminal circuit 22, a second negative-resistance circuit element 23, represented by a series circuit of a negative resistance ($-R_6$) and an accompanying inductance $L_6$, and a load 24, represented by a load resistance $Z_{06}$, are connected in series. It is evident that with this arrangement, a four-terminal type, negative-resistance amplifier according to the present invention which is matched with the signal source 20 and the load 24 is obtained through the composite circuit comprising the circuit elements 21, 22, and 23 as shown in FIG. 8. Similarly as in the case illustrated in FIG. 3, it is apparent that also in the case wherein the four-terminal constants of the four-terminal circuit 22 shown in FIG. 8 are close to the values indicated by the Equations xxxix, xxxx, xxxxi, and xxxxii, a four-terminal type, negative-resistance amplifier according to the invention is obtained.

As is described above, since a non-reciprocal element such as a circulator or an isolator is not included in the amplifier of the present invention, its operation is of reciprocal characteristic. That is if in the circuit arrangements of FIGS. 2 and 3 the constant-current source $I_0$ of the circuits 1 and 8 are removed and a constant-current source is connected in parallel to the conductance $y_{02}$, in each of the circuits 7 and 12, it will be possible to consume the amplified power in the conductance $y_{01}$ of the circuits 1 and 8. If in the circuit arrangements of FIGS. 7 and 8 the constant-voltage source $E_0$ in each of the circuits 13 and 20 is removed, and a constant-voltage source is connected in series with $Z_{06}$ of each of the circuits 19 and 24, it will be possible to consume the power amplified in $Z_{05}$ in each of the circuits 13 and 20.

In the case wherein non-reciprocal amplification is required, or in the case wherein a high degree of stable amplification is required, it is possible to put the unique features of the amplifier of this invention to even greater use by connecting a non-reciprocal circuit such as an isolator or circulator to the output side, the input side, or both sides.

In the amplifier according to the present invention, when the gain of each of the individual amplifiers is within certain limits, cascade connection is possible in the sense described on page 175 of the "Denki Kogaku Handbook" (Electrical Engineering Handbook) published on July 25, 1951 by the Institute of Electrical Engineers of Japan. By replacing two negative-resistance elements connected to cascade connected terminals with one negative-resistance element having an equivalent circuit constant of combined value, it is possible to reduce the construction of the four-terminal type, negative-resistance amplifier according to the present invention of cascade connection type to an even simpler form. In the case wherein combined use of non-reciprocal circuits is possible, it is possible to obtain a stable, high-gain amplifier in a simple manner by cascade connecting amplifiers of the present invention and non-reciprocal circuits such as circulators or isolators alternately in any number of stages.

As can be readily seen from the foregoing description and mathematical analysis, the present invention provides arrangements of a stable, four-terminal type, negative-resistance amplifier which does not contain a circuit which separates incident waves and reflected waves, and which, moreover, is matched, by connecting a plurality of negative-resistance elements by way of a circuit which effects phase shifting to a degree equal to an odd number multiple of 90 degrees or to approximately an odd number multiple of 90 degrees, whereby it is possible to exhibit fully the characteristics of an amplifier of wide band and low noise in the high-frequency band.

What is claimed is:

1. A negative-resistance amplifier comprising, first negative-resistance means, means to apply a signal input to be amplified to said negative-resistance means, first tuning circuit means connected to receive the output of said first-negative resistance means, a phase-shifting circuit means connected to receive the output of said tuning circuit means to change the phase of said output through an odd number multiple of approximately 90 degrees, second tuning circuit means connected to receive the output of said phase-shifting circuit means, and second negative-resistance means, connected to receive the output of said second tuning circuit means.

2. A negative-resistance amplifier comprising, first negative-resistance circuit means, means to apply a signal input to be amplified to said negative-resistance means, first tuning circuit means tunable to said input and connected to receive the output of said first-negative resistance means, means to cancel reflected waves in said amplifier comprising a phase-shifting circuit means connected to receive the output of said tuning circuit means to change the phase of said output through an odd number multiple of approximately 90 degrees, second tuning circuit means connected to receive the output of said phase-shifting circuit means, second negative-resistance circuit means connected to receive the output of said tuning circuit means, and connections to said second negative-resistance circuit means to take out an amplified output from said amplifier and to connect a load thereto.

3. A negative-resistance amplifying circuit comprising, first negative-resistance means, means to apply a signal input to be amplified to said negative-resistance means, first tuning circuit means comprising tank circuit means connected to receive the output of said first-negative resistance means, a phase-shifting circuit means connected to receive the output of said tuning circuit means to change the phase of said output through an odd number multiple of approximately 90 degrees, second tuning circuit means comprising second tank circuit means connected to receive the output of said phase-shifting circuit means, and second negative-resistance means connected to receive the output of said tuning circuit means, and connections to said second negative-resistance means to take out an amplified output from said amplifier.

4. A negative-resistance amplifying circuit according to claim 3, in which said first tuning circuit means and said first negative resistance means are connected in parallel, and in which second negative-resistance means and second tuning circuit means are connected in parallel.

5. A negative-resistance amplifying circuit according to claim 3, including means connecting said first tuning circuit means and said first negative resistance means in series, and means connecting said second negative-resistance means and second tuning circuit means in series.

References Cited by the Examiner

UNITED STATES PATENTS

| | | | |
|---|---|---|---|
| 2,788,496 | 4/57 | Linvill | 333—80 |
| 2,933,703 | 4/60 | Kinariwala | 333—80 |
| 3,040,267 | 6/62 | Seidel | 330—34 X |
| 3,051,846 | 8/62 | Schott | 307—88.5 |

ROY LAKE, *Primary Examiner.*

NATHAN KAUFMAN, *Examiner.*